United States Patent
Wang

(10) Patent No.: US 9,185,791 B2
(45) Date of Patent: Nov. 10, 2015

(54) MANUFACTURING METHOD OF PRINTING CIRCUIT BOARD WITH MICRO-RADIATORS

(75) Inventor: Zheng Wang, Zhuhai (CN)

(73) Assignee: RAYBEN TECHNOLOGIES (ZHUHAI) LIMITED, Zhuhai (CN)

( * ) Notice: Subject to any disclaimer, the term of this patent is extended or adjusted under 35 U.S.C. 154(b) by 278 days.

(21) Appl. No.: 13/514,999

(22) PCT Filed: Jan. 6, 2011

(86) PCT No.: PCT/CN2011/070051
§ 371 (c)(1),
(2), (4) Date: Sep. 14, 2012

(87) PCT Pub. No.: WO2012/083595
PCT Pub. Date: Jun. 28, 2012

(65) Prior Publication Data
US 2012/0329183 A1    Dec. 27, 2012

(30) Foreign Application Priority Data
Dec. 24, 2010  (CN) ............ 2010 1 0604353

(51) Int. Cl.
| | |
|---|---|
| H01L 33/62 | (2010.01) |
| H05K 1/02 | (2006.01) |
| H01L 33/64 | (2010.01) |
| H05K 3/46 | (2006.01) |

(52) U.S. Cl.
CPC ............ *H05K 1/0204* (2013.01); *H01L 33/642* (2013.01); *H05K 3/4623* (2013.01); *H05K 2201/10106* (2013.01); *H05K 2203/063* (2013.01)

(58) Field of Classification Search
CPC ...... H05K 1/0206; H05K 1/204; H01L 33/62; H01L 33/64; H01L 33/642; H01L 33/0095; H01L 24/14; H01I 33/647
USPC ........................................................ 438/26
See application file for complete search history.

(56) References Cited

U.S. PATENT DOCUMENTS

| | | | |
|---|---|---|---|
| 7,745,244 B2 * | 6/2010 | Yuan et al. ................. | 438/33 |
| 2008/0179618 A1 * | 7/2008 | Cheng ....................... | 257/99 |
| 2009/0260858 A1 * | 10/2009 | Nakai et al. ............... | 174/252 |
| 2010/0065307 A1 * | 3/2010 | Nagase et al. ............. | 174/252 |
| 2010/0248569 A1 * | 9/2010 | Peng et al. ................. | 442/31 |

* cited by examiner

*Primary Examiner* — Savitr Mulpuri

(57) ABSTRACT

The present invention relates to a manufacturing method of a printing circuit board. The manufacturing method mainly includes: forming one or more cylindrical micro-radiators by cutting a high conductive and electrical insulating substrate according to predetermined size; manufacturing one or more mounting holes in copper clad plates and prepregs; embedding the cylindrical micro-radiators into the mounting holes. The present invention combines the micro-radiator with high thermal conductivity and traditional stiffness printing circuit board. The printing circuit board with micro-radiators has the advantages of high thermal conductivity and stable heat transfer, and also has the advantages of routing flexibility and reliable electrical connections.

6 Claims, 2 Drawing Sheets

US 9,185,791 B2

MANUFACTURING METHOD OF PRINTING CIRCUIT BOARD WITH MICRO-RADIATORS

FIELD OF THE INVENTION

The present invention relates to printing circuit boards, particularly, the present invention relates to a manufacturing method of a printing circuit board with an insulated micro-radiators.

BACKGROUND OF THE INVENTION

Printing circuit boards (PCBs) are one of important elements in electronics industry. PCBs are used as mechanical support elements for the electronic components, and realize electrical connection among the electronic components. In addition, graphics and numbers of the components can be printed on the PCBs, it is convenient for furnishing, checking or maintaining the components. The PCBs are used in almost every electronic device, such as electronic watch, calculator, computer, communication electronics device, military weapon systems.

Traditional PCBs are plated through hole structure, insulation material among layers is FR4 material, the thermal conductivity of the insulation material is 0.4 W/mk. In recent years, the thermal conductivity of the insulation material is 1.3-2.2 W/mk. When plenty of integrated circuits (especially high power LED) are installed on the printing circuit board, the thermal conductivity of the printing circuit board come up to tens or hundreds of W/mk. Obviously, it is far beyond the thermal conductivity of the insulation material of the prior art.

Therefore, there are some shortcomings in the prior art.

SUMMARY OF THE INVENTION

An object of the present invention is to provide a manufacturing method of the printing circuit board with an insulated micro-radiators.

The object of the present invention is realized by use the technical solutions as follows:

A manufacturing method of a printing circuit board with an insulated micro-radiators includes:

step A210: providing a high thermal conductive and electrical insulating substrate covered by copper foils on a top surface and a bottom surface thereof, and forming one or more cylindrical insulated micro-radiators by cutting the substrate according to predetermined size;

step A220: providing N (N>1) layers single-sided or double-sided copper clad plates and (N−1) layers prepregs, cutting the copper clad plates and the prepregs into working panels of the PCB according to predetermined size, and manufacturing inner-layer circuit in the copper clad plates by using traditional image transferring method for a PCB copper pattern;

step A230: manufacturing one or more mounting holes in the copper clad plates and the prepregs by using drilling, milling, or punching, the shape and size of the mounting holes adapting to the cylindrical insulated micro-radiators;

step A240: laminating the copper clad plates and the prepregs with the conventional multi-layer PCB laying up method, making two copper clad plates to be located at the top and the bottom layers respectively, embedding the cylindrical insulated micro-radiators into the corresponding mounting holes;

step A250: pressing the copper clad plates and the prepregs together with the standard pressing method of the conventional multi-layer PCB;

step A260: according to the manufacturing method of a conventional PCB, carrying out hole drilling, Plated Through Hole plating, outer-layer image transferring, solder resist printing, surface finishing, outline fabrication for laminated working panels and soldering heating elements on the top surface of the insulated micro-radiators, then the PCB with the insulated micro-radiator is done.

As the preferable technical proposal of the invention, in step A220 and step A260, the copper foil on a top surface of the insulated micro-radiator is electrically connected to the inner or outer circuit, and the copper foil on a bottom surface of the insulated micro-radiator is electrically insulated from the inner and outer circuit.

As the preferable technical proposal of the invention, in step A240, both a top surface and a bottom surface of the multi-layer printing circuit board are copper clad.

As the preferable technical proposal of the invention, the heating elements are LED chips.

As the preferable technical proposal of the invention, in step A210, the insulated micro-radiator is elliptic cylindrical, cube-shaped or cylinder shape, when the insulated micro-radiator is cylinder shape, both the top surface and the bottom surface are rhombus, triangle or trapezoid.

As the preferable technical proposal of the invention, in step A210, the high thermal conductive and electrical insulating substrate is made from alumina ceramic, aluminum nitride ceramic, silicon carbide, or diamond.

Compared with the prior art, the present invention combines the micro-radiators with high thermal conductivity and traditional rigid printing circuit board. The printing circuit board with micro-radiators has the advantages of high thermal conductivity and stable heat transfer, and also has the advantages of routing flexibility and reliable electrical connections. The heat coming from the heating elements can be conducted out of the printing circuit board in time and effectively. The printing circuit board with micro-radiators is the ideal carrier board for the heating element and heating element array. The manufacturing method of the printing circuit board with micro-radiators has the advantages of simplicity and strong practicability.

DETAILED DESCRIPTION OF THE DRAWINGS

DETAILED DESCRIPTION OF THE PREFERRED EMBODIMENT

Figure 1:
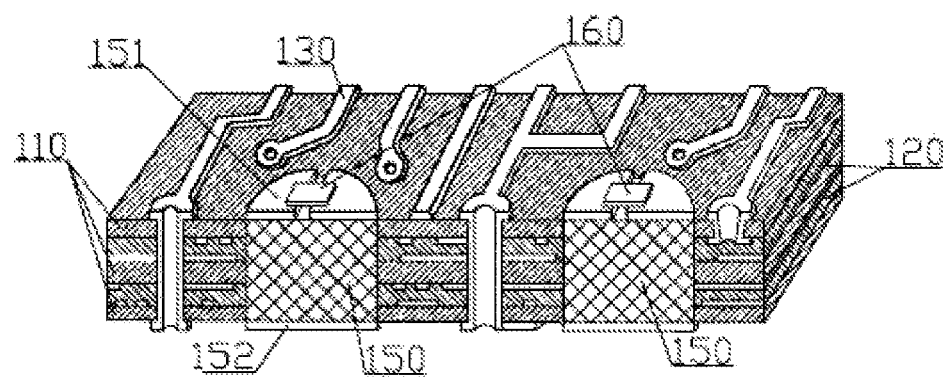
FIG. 1 is a schematic cross-sectional view illustrating the printing circuit board with insulated micro-radiators of the present invention.

As shown in FIG. 1, the printing circuit board is a rigid PCB, and includes a substrate. The substrate consists of 3 layers of copper clad plates 110 and 2 layers of prepregs 120. The 3 layers of copper clad plates 110 and the 2 layers of prepregs 120 are cross-laminated. A top layer and a bottom layer are copper clad plates 110. A top surface and a bottom surface of each copper clad plate 110 are covered copper circuit 130. The printing circuit board also includes a plurality of cylindrical insulated micro-radiators 150, each cylindrical insulated micro-radiator 150 is embedded into a cylindrical hole of the substrate. The height of the micro-radiator 150 is equal to the thickness of the substrate. A top surface 151 and a bottom surface 152 of the micro-radiator are covered by copper foils. A LED chip 160 is installed on the top surface 151, and the power signal input of the LED chip 160 is electrically connected to the inner circuit of the printing circuit board, and the bottom surface 152 of the micro-radiator 150 is insulated from other circuits of the printing circuit board.

The insulated micro-radiator 150 is made of electrical insulating material, such as alumina ceramic, aluminum nitride ceramic, silicon carbide, diamond, and so on. The thermal conductivity between the top surface 151 and the bottom surface 152 of the micro-radiator 150 can be achieved to 20-1000 W/mk.

When the LED chip 160 is operating, the LED is lighting and emitting heat continuously. The heat is transferred from the top surface 151 to the bottom surface 152 of the insulated micro-radiator 150 by the thermal conductive base, then transferred out of the printing circuit board by copper foil of the bottom surface 152.

Figure 2:
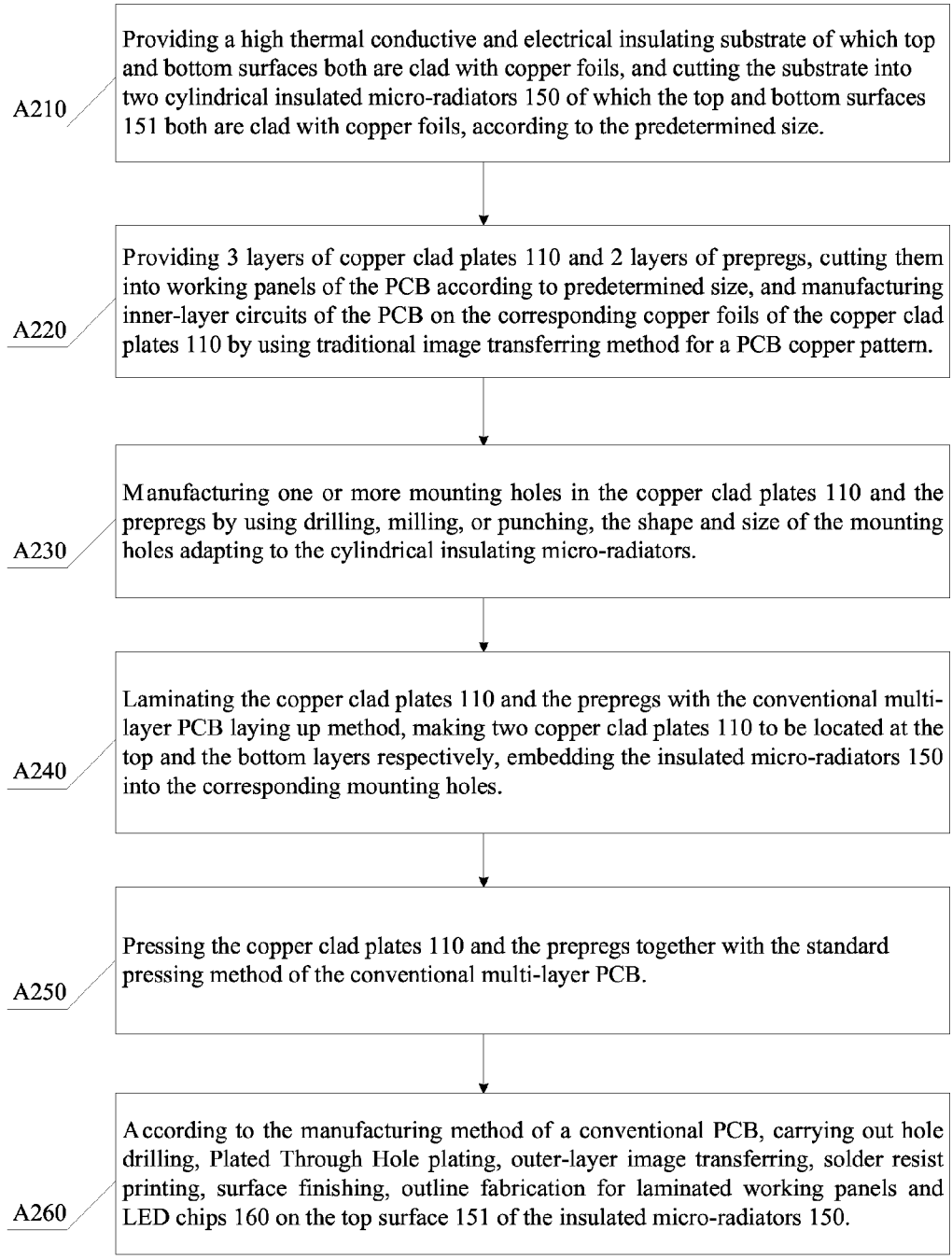
FIG. 2 is a flowchart of the manufacturing method of the printing circuit board with insulated micro-radiators of FIG. 1.

As shown in FIG. 2, the manufacturing method of the printing circuit board of FIG. 1 includes the following steps:

A210: providing a high thermal conductive and electrical insulating substrate, and forming a plurality of cylindrical insulated micro-radiators by cutting the substrate according to predetermined size.

The top surface and the bottom surface of the substrate are covered by copper foils. The top surface 151 and the bottom surface 152 of each cylindrical insulated micro-radiator are covered by copper foils.

The substrate is made of electrical insulating material, such as alumina ceramic, aluminum nitride ceramic, silicon carbide, diamond, and so on.

A220: providing 3 layers of copper clad plates 110 and 2 layers of prepregs, cutting the 3 layers of copper clad plates 110 and the 2 layers of prepregs into working panels of the PCB according to predetermined size, and manufacturing inner-layer circuit in the copper clad plates by using traditional image transferring method for a PCB copper pattern.

A230: manufacturing a plurality of mounting holes in copper clad plates and prepregs by using drilling, milling, or punching, the shape and size of the mounting holes adapting to the cylindrical insulated micro-radiators 150.

A240: laminating the copper clad plates and the prepregs with the conventional multi-layer PCB laying up method, making two copper clad plates to be located at the top and the bottom layers respectively, and embedding the cylindrical insulated micro-radiators into the corresponding mounting holes.

A250: pressing the copper clad plates and the prepregs together with the standard pressing method of the conventional multi-layer PCB.

A260: according to the manufacturing method of a conventional PCB, carrying out hole drilling, Plated Through Hole plating, outer-layer image transferring, solder resist printing, surface finishing, outline fabrication for laminated working panels and soldering heating elements on the top surface of the insulated micro-radiators 150, then the PCB with the insulated micro-radiator is done.

Copper foil on a top surface of the insulated micro-radiator 150 is electrically connected to the inner circuit, and copper foil on a bottom surface of the insulated micro-radiator 150 is electrically insulated from the inner circuit.

The manufacturing method of the present invention is not limited by the preferred embodiments, all the equivalent change and modification according to the present invention are covered by the protection scope of the claims. For example:

In step A260, one or more heating element such as LED elements or integrated circuit chip can be installed on the top surface 151 of the micro-radiators 150.

In step A220, the number of the copper clad plates 110 can be N(N>1), the number of the prepregs can be N−1, and the number of the layers of the printing circuit board is 2N−1.

In step A220, the single-sided or double-sided copper clad plates are provided. If the single-sided copper clad plates are provided, both a top surface and a bottom surface of the multi-layer printing circuit board should be copper clad during the process of pressing the copper clad plates and the prepregs.

In step A210, the micro-radiator is elliptic cylindrical, cube-shaped or cylinder shape, when the micro-radiator is cylinder shape, both the top surface and the bottom surface are rhombus, triangle or trapezoid. The number of the micro-radiators depends on the need of the actual circuit, it can be one or more.

Heating elements are electrically connected to the inner or outer circuit of the printing circuit board.

The invention claimed is:

1. A manufacturing method of a printing circuit board (PCB) with an insulated micro-radiator, consisting of:
   providing a high thermal conductive and electrical insulating substrate covered by copper foils on a top surface and a bottom surface thereof, and forming one or more cylindrical insulated micro-radiators by cutting the substrate according to predetermined size;
   providing N layers single-sided or double-sided copper clad plates and N−1 layers prepregs, cutting the copper clad plates and the prepregs into working panels of the PCB according to predetermined size, and manufacturing inner-layer circuit in the copper clad plates by using traditional image transferring method for a PCB copper pattern, wherein N>1;
   manufacturing one or more mounting holes in the copper clad plates and the prepregs by using drilling, milling, or punching, the shape and size of the mounting holes adapting to the cylindrical insulated micro-radiators;
   laminating the copper clad plates and the prepregs with the conventional multi-layer PCB laying up method, making two copper clad plates to be located at the top and the bottom layers respectively, embedding the cylindrical insulated micro-radiators into the corresponding mounting holes;
   pressing the copper clad plates and the prepregs together with the standard pressing method of the conventional multi-layer PCB;
   according to the manufacturing method of a conventional PCB, carrying out hole drilling, Plated Through Hole plating, outer-layer image transferring, solder resist printing, surface finishing, outline fabrication for laminated working panels and soldering heating elements on the top surface of the insulated micro-radiators, then the PCB with the insulated micro-radiator is done.

2. The manufacturing method of the printing circuit board of claim 1, wherein the insulated micro-radiator is elliptic cylindrical, cube-shaped or cylinder shape, when the insulated micro-radiator is cylinder shape, both the top surface and the bottom surface are rhombus, triangle or trapezoid.

3. The manufacturing method of the printing circuit board of claim 1, wherein the high thermal conductive and electrical insulating substrate is made from alumina ceramic, aluminum nitride ceramic, silicon carbide, or diamond.

4. The manufacturing method of the printing circuit board of claim 1, wherein the copper foil on the top surface of the insulated micro-radiator is electrically connected to the inner or outer circuit, and the copper foil on the bottom surface of the insulated micro-radiator is electrically insulated from the inner and outer circuit.

5. The manufacturing method of the printing circuit board of claim 1, wherein both a top surface and a bottom surface of the multi-layer printing circuit board are copper clad.

6. The manufacturing method of the printing circuit board of claim 1, wherein the heating elements are LED chips.

\* \* \* \* \*